United States Patent [19]

Sakurai

[11] Patent Number: 4,865,491

[45] Date of Patent: Sep. 12, 1989

[54] APPARATUS FOR POSITIONING A SEMICONDUCTOR WAFER

[75] Inventor: Yoshimichi Sakurai, Kanagawa, Japan

[73] Assignee: Sony Corporation, Tokyo, Japan

[21] Appl. No.: 256,268

[22] Filed: Oct. 11, 1988

Related U.S. Application Data

[63] Continuation of Ser. No. 122,618, Nov. 19, 1987, abandoned, which is a continuation of Ser. No. 839,634, Mar. 14, 1986, abandoned.

[30] Foreign Application Priority Data

Mar. 14, 1985 [JP] Japan .................................. 60-50810

[51] Int. Cl.⁴ ............................................. B65G 47/24
[52] U.S. Cl. ....................................... 406/87; 406/84; 406/88
[58] Field of Search ............................ 406/84, 86–88, 406/51, 73; 198/380; 414/755

[56] References Cited

U.S. PATENT DOCUMENTS

| | | | |
|---|---|---|---|
| 3,865,254 | 2/1975 | Johannsmeier | 406/87 X |
| 3,890,508 | 6/1975 | Sharp | 406/87 X |
| 3,982,627 | 9/1976 | Isohata | 406/87 X |
| 4,165,132 | 8/1979 | Hassan et al. | 406/87 X |
| 4,242,038 | 12/1980 | Santini et al. | 414/755 |
| 4,348,139 | 9/1982 | Hassan et al. | 406/84 X |
| 4,425,075 | 1/1984 | Quinn | 406/87 X |

OTHER PUBLICATIONS

O'Neill et al; Annular Orientor; IBM TDB vol. 20, No. 2, Jul. 1977; pp. 593–594.

Jorgensen et al; Precision Wafer Orientation and Transfer System; IBM TDB vol. 16, No. 9, Feb. 1974; pp. 2910–2911.

Primary Examiner—Joseph F. Peters, Jr.
Assistant Examiner—James M. Kannofsky
Attorney, Agent, or Firm—Hill, Van Santen, Steadman & Simpson

[57] ABSTRACT

An improved semiconductor wafer positioning apparatus which can achieve preliminary positioning of a semiconductor wafer with accuracy. The apparatus includes a positioning stage for receiving a semiconductor wafer thereon. The positioning stage has a pair of groups of semicircular grooves formed on an upper face thereof and communicated with an air sucking and blowing ports. Thus, air is blown out from the upper face of the positioning stage so that the semiconductor wafer is rotated by a blow of air. Meanwhile, the positioning stage is inclined a small angle so that the semiconductor wafer is moved downward by its own weight on the positioning stage until a positioning element is contacted with an orientation flat of the wafer to stop rotation of the wafer, thereby positioning the wafer in position.

9 Claims, 5 Drawing Sheets

APPARATUS FOR POSITIONING A SEMICONDUCTOR WAFER

This is a continuation of application Ser. No. 122,618, filed Nov. 19, 1987, now abandoned, which is a continuation of application Ser. No. 839,634, filed Mar. 14, 1986, now abandoned.

BACKGROUND OF THE INVENTION

1. Field of the Invention

This invention relates to an apparatus for positioning a semiconductor device which apparatus is used in a field of production of semiconductor devices.

More particularly, the invention relates to a preliminary positioning apparatus for positioning a semiconductor wafer with efficiency and high accuracy on a semiconductor system when the semiconductor wafer is to be supplied to a semiconductor producing apparatus.

2. Prior Art

In production of semiconductor devices, positioning of a semiconductor wafer is important in a light exposure step, a line width measuring step, and so on. Normally, such positioning involves preliminary positioning (what is called prealignment) before a semiconductor wafer is fed to a light exposure apparatus, and final positioning (what is called final alignment) after the semiconductor wafer has been fed to the light exposure apparatus. In conventional preliminary positioning, a semiconductor wafer fed to a flat support plate is pushed and rotated by a few rollers located around an outer periphery of the semiconductor wafer while it is floated by air blown thereto. During such rotation of the semiconductor wafer, an orientation flat of the semiconductor wafer (a straight edge portion of a semiconductor wafer along which a circumferential edge of the semiconductor wafer is cut away) is detected, and then the orientation flat of the semiconductor wafer is contacted with a flat face of a positioning means thereby to position the semiconductor wafer.

After then, using a transporting means having a suitable means such as a vacuum attracting means, the semiconductor wafer is removed from the preliminary positioning support plate and placed onto a semiconductor wafer positioning stage, for example, of a light exposure apparatus. Then, the vacuum attracting means of the transporting means is rendered inoperative while the semiconductor wafer is attracted in position by another vacuum attracting means which may be provided on the positioning stage of the light exposure apparatus. However, in the case of delivery by air using such a vacuum attracting means, a semiconductor wafer is supported while it is slid by an air layer below. Accordingly, notwithstanding such preliminary positioning, there will often occur a displacement or dislocation of a semiconductor wafer when it is attracted to the transporting means or when it is transferred from the transporting means to the positioning stage.

Meanwhile, in such a conventional preliminary positioning apparatus, contamination of a semiconductor wafer is readily caused by a few rollers which contact with an outer periphery of a semiconductor wafer, and a sensor for detecting and a catcher for catching an orientation flat of a semiconductor wafer. Besides, such a conventional preliminary positioning apparatus requires a large number of components. Further, in case such components as described above which engage with a semiconductor wafer are abrased, the total amount of such abrasion will deteriorate accuracy in positioning a semiconductor wafer. In addition, while the conventional preliminary positioning apparatus is constituted such that a catcher for catching an orientation flat of a semiconductor wafer is brought into contact with a semiconductor wafer at a predetermined timing after the orientation flat of the semiconductor wafer has been detected, if the timing is missed or lost, the semiconductor wafer will stop at a position in which a portion thereof other than the orientation flat is contacted with the catcher, resulting in failure of positioning of the semiconductor wafer.

If a semiconductor wafer is transported to a positioning stage while accurate preliminary positioning is not attained in this manner, following problems will occur: final positioning of a semiconductor wafer requires much time; where final positioning is effected automatically, accuracy will not come within a range in which automatic positioning is allowed, resulting in failure in automatic final positioning of a semiconductor wafer; and the number of products per unit time (throughput) is reduced.

SUMMARY OF THE INVENTION

It is an object of the present invention to provide an apparatus for positioning, particularly for preliminarily positioning, a semiconductor wafer which apparatus is improved in such problems as described above.

It is another object of the invention to provide a semiconductor wafer positioning apparatus wherein a semiconductor wafer can be preliminarily positioned accurately with an error one tenth or less to that in a conventional apparatus by blowing out air from a face of a stage on which the semiconductor wafer is received to rotate the semiconductor wafer and by engaging a positioning means with an orientation flat of the wafer.

It is a further object of the invention to provide a semiconductor wafer positioning apparatus which is simplified in construction and includes a significantly reduced number of parts by constituting the apparatus such that positioning of a semicnductor wafer is effected while a positioning stage is in its inclined condition and which prevents contamination of a semiconductor wafer by reducing the number of parts which contact with the semiconductor wafer.

It is a still further object of the invention to provide a semiconductor wafer positioning apparatus which can control a floating amount and a rotational force of a semiconductor wafer to attain positioning of the semiconductor wafer with high accuracy by forming concentrical air flowing grooves on a positioning stage.

It is a yet further object of the invention to provide a semiconductor wafer positioning apparatus which can provide a suitable floating amount and a suitable rotational force to a semiconductor wafer by supplying air to concentrical air flowing grooves formed on a positioning stage by way of an air blowing hole provided other than the concentrical air flowing grooves.

It is a still another object of the invention to provide a semiconductor wafer positioning apparatus which can minimize displacement or dislocation of a semiconductor wafer by attracting the entire semiconductor wafer uniformly to a positioning stage by means of concentrically formed grooves.

It is a yet another object of the invention to provide a semiconductor wafer positioning apparatus which can provide a good rotational force to a semiconductor wafer by forming a plurality of separate groups of concentrical circular grooves on a positioning stage.

It is an additional object of the invention to provide a semiconductor wafer positioning apparatus which is improved in engagement of a positioning member with a semiconductor wafer to attain positioning of the semiconductor wafer with high accuracy by rotating the semiconductor wafer while a positioning stage is in an inclined condition.

DESCRIPTION OF THE PREFERRED EMBODIMENT

A positioning apparatus according to the present invention comprises a stage for receiving a semiconductor wafer thereon, a means for blowing air from a pair of faces of the stage on which a semiconductor wafer is received to rotate the semiconductor wafer, and a positioning means for engaging with an orientation flat of the semiconductor wafer to stop rotation of the semicnductor wafer.

The rotating means for rotating a wafer includes a pair of independent semicircular groove groups formed around the center and on the faces of the stage on which the semiconductor wafer is received. Each of the semicircular groove groups includes a plurality of semicircular grooves which are communicated with each other by means of connecting grooves. A pair of air ports for sucking air to vacuum and for blowing air therethrough are provided at symmetrical positions of the semicircular groove groups.

The stage is mounted for inclining movement by an angle of 3 to 5 degrees toward the positioning means.

Meanwhile, the positioning means includes three positioning pins two of which are mounted for engagement with an orientation flat of a semiconductor wafer while the remaining positioning pin is mounted for engagement with a periphery of the semiconductor wafer.

When a semiconductor wafer is transported onto the faces of the stage, air is sucked from within the grooves of the stage through the air ports to attract the semiconductor wafer to the faces of the stage by vacuum. In this condition, the stage is inclined to an angle of 3 to 5 degrees, and then the pins of the positioning means are brought to respective positions corresponding to a periphery of the semiconductor wafer. Then, a changeover means not shown is operated so that air is now blown from the air ports and then above the stage faces. In this instance, air will flow in directions as indicated by arrow marks in FIG. 2 in the semicircular groove groups to rotate the semiconductor wafer on the stage faces while the semiconductor wafer will move down along the inclined faces of the stage due to the weight of itself until it is brought into contact with the positioning pins. Then, as the pins are contacted with the orientation flat and a peripheral portion of the semiconductor wafer, respectively, the rotation of the semiconductor wafer is stopped thereby to position the orientation flat of the semiconductor wafer. Then, the semiconductor wafer is attracted to the stage faces by vacuum and is then transferred to an apparatus for final positioning.

Now, a preferred embodiment of an apparatus for positioning a semiconductor wafer according to the present invention will be described with reference to the accompanying drawings.

Figure 1:
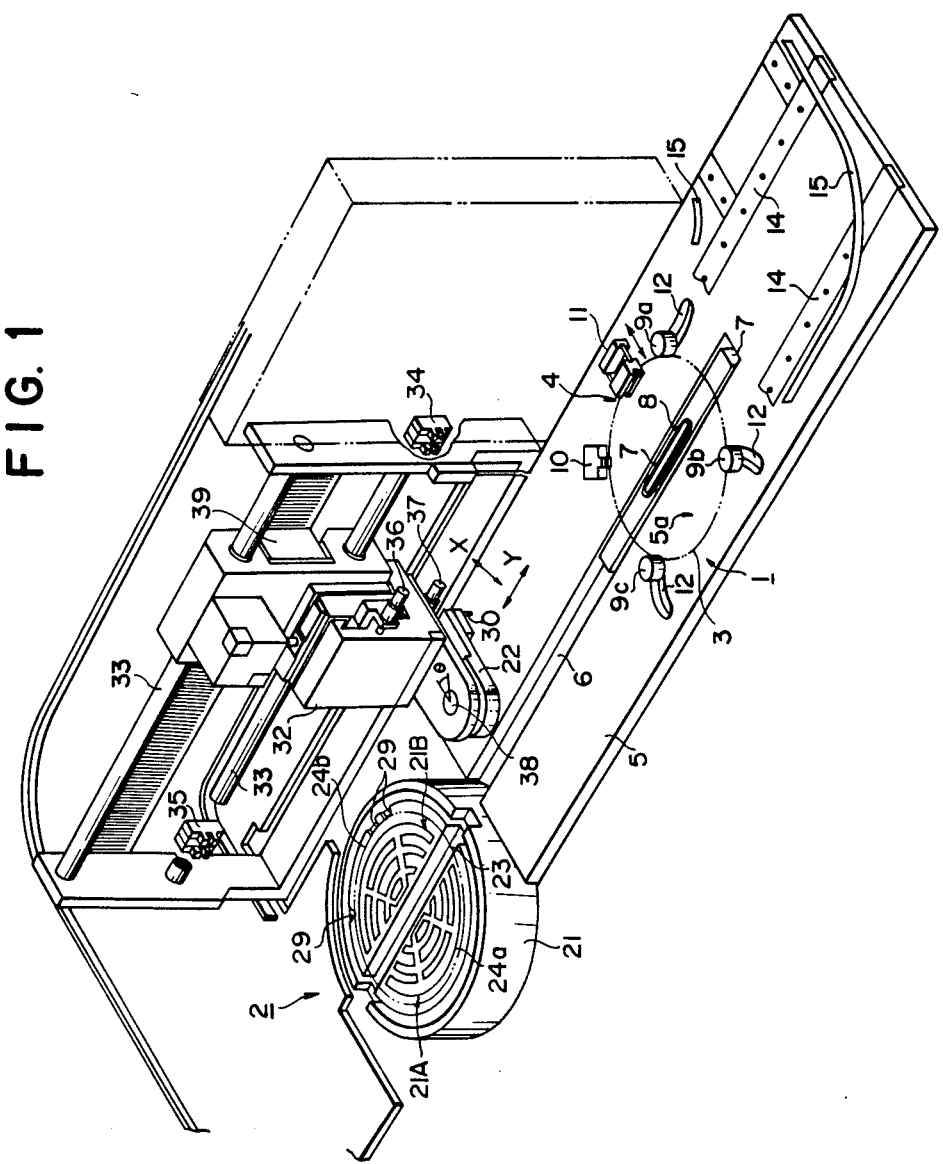
FIG. 1 is a perspective view showing a preferred embodiment of a preliminary positioning apparatus according to the present invention.

Referring first to FIG. 1, reference numeral 1 denotes a first preliminary positioning apparatus, 2 a second preliminary positioning apparatus which is constructed in accordance with the present invention, and 3 a semiconductor wafer (refer to FIG. 4) to be positioned which has an orientation flat 4 thereon.

The first preliminary positioning apparatus 1 may be of any known type, and while the second preliminary positioning apparatus 2 according to the invention can itself attain positioning with high accuracy, if it is combined with such a first preliminary positioning apparatus as the apparatus 1, then positioning by the second preliminary positioning apparatus 2 can be attained more efficiently.

The first preliminary positioning apparatus 1 includes a table 5 for receiving thereon a semiconductor wafer 3 transported thereto. A carrying member 7 for transporting a semiconductor wafer 3 to the second preliminary positioning apparatus 2 is disposed in a slot 6 which is formed in a central portion of the table 5 and extends toward the second preliminary positioning apparatus 2.

The carrying member 7 is mounted for movement along the slot 6 of the table 5, and a vacuum chuck 8 for attracting a semiconductor wafer 3 thereto by vacuum is mounted on an upper face 7a of the carrying member 7. In this case, an upper face 5a of the table 5 and the upper table 7a of the carrying member 7 are located in a same plane. Three rollers 9a, 9b and 9c for contacting with a semiconductor wafer 3 to rotate it are mounted on the table 5. A sensor 10 for detecting an orientation flat 4 of a semiconductor wafer 3 is mounted at a position on the carrying member 7 corresponding to an outer periphery of a semiconductor wafer 3, and a catcher 11 for engaging with an orientation flat 4 of a semiconductor wafer 3 to position the wafer 3 is mounted at another position on the carrying member 7 corresponding to an outer periphery of a semiconductor wafer 3 and a little spaced from the position of the sensor 10. The rollers 9a, 9b and 9c are disposed for movement along respective elongated holes 12, and one 9a of the rollers 9a, 9b and 9c is directly coupled to a drive source not shown. The catcher 11 is mounted for movement in a direction as indicated by an arrow mark, and when an orientation flat 4 of a wafer 3 is detected by the sensor 10, the catcher 11 is moved until it is just contacted with the orientation flat 4 of the wafer 3 to catch the wafer 3 thereon. A pair of so-called air tracks 14 for feeding a semiconductor wafer 3 by means of air flows extend along a feeding path 13 up to the first preliminary positioning apparatus 1. Designated by a reference numeral 15 is a guide.

Meanwhile, the second preliminary positioning apparatus 2 includes a circular stage 21 for receiving a semiconductor wafer 3 thereon, and a positioning means 22 for engaging with an outer periphery of a semiconductor wafer 3 to position an orientation flat 4 of the semiconductor wafer 3.

Figure 2:
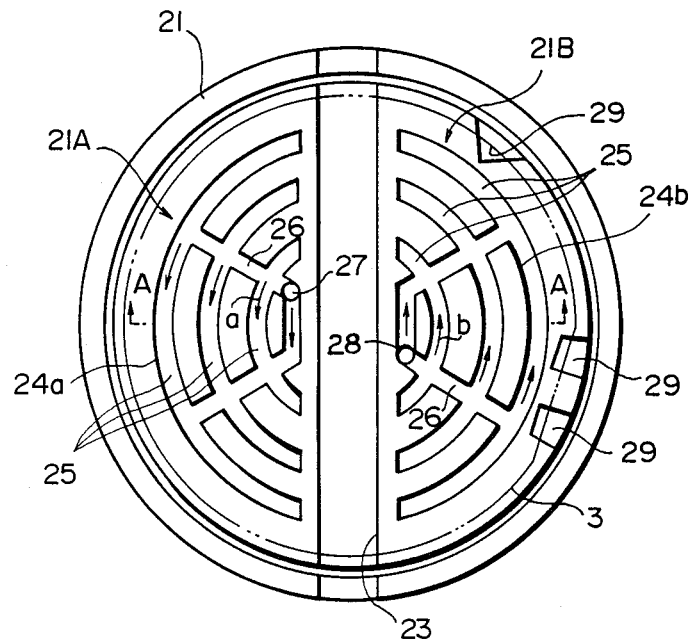
FIG. 2 is a plan view of a stage of the positioning apparatus of FIG. 1.
Figure 3:
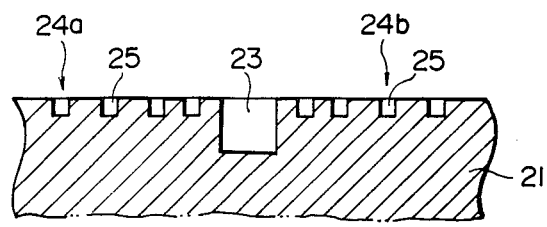
FIG. 3 is a cross sectional view taken along line A—A of FIG. 2.

The stage 21 has a groove 23 formed diametrically therein for allowing the carrying member 7 of the first preliminary positioning apparatus 1 to pass therealong. The stage 21 has a pair of upper faces 21A and 21B defined by the diametrical groove 23 and having thereon semicircular groove groups 24 (24a, 24b) which serve as a vacuum chuck and also as means for rotating a wafer 3. The semicircular groove groups 24a and 24b each include a plurality of concentrical semicircular grooves 25 and connecting grooves 26 which communicate the semicircular grooves 25 with each other as seen in FIGS. 2 and 3. A pair of air ports 27 and 28 are provided at symmetrical positions of the semicircular groove groups 24a and 24b relative to the common center of the semicircular grooves 25, that is, the center of the stage 21. A vacuum attracting means and an air blowing means are alternatively coupled to the air ports 27 and 28 by way of respective change-over means not shown. Three notches 29 for receiving the positioning pins 30a, 30b and 30c of the positioning means 22 are formed in the stage 21. The stage 21 is mounted for inclining movement by an angle of 3 to 5 degrees toward the positioning means 22 around a shaft 31 (see FIG. 5) which extends in parallel to the diametrical groove 23 of the stage 23. The stage 21 can also pivot by an angle of 90 degrees in the opposite direction. Such means for inclining the stage 21 toward the positioning means 22 may include a plate cam 43 for contacting with a projection 45 on a bottom face of a support 44 for the stage 21, and a pin cylinder 42 for moving the plate cam 43, as seen from FIGS. 5A to 5C. Thus, when the projection 45 of the support 44 for the stage 21 is in contact with a higher portion of a cam face of the plate cam 43, the stage 21 is maintained in its horizontal position, but if the plate cam 43 is moved by the pin cylinder 42, the stage 21 is inclined.

Figure 4:
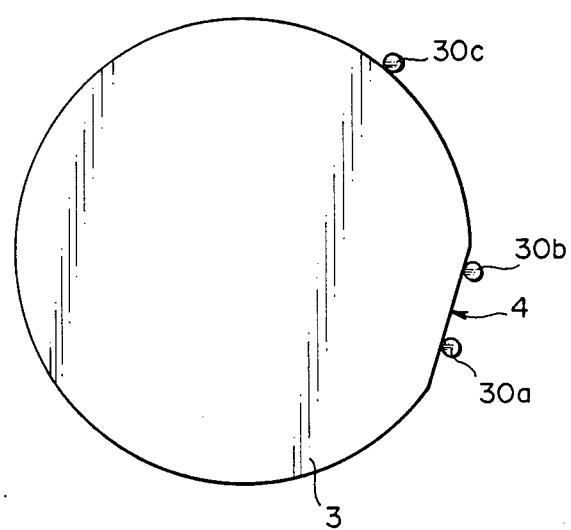
FIG. 4 is a plan view illustrating a semiconductor wafer to be positioned.

The positioning means 22 includes the three positioning pins 30 (30a, 30b and 30c). The three positioning pins 30a, 30b and 30c are arranged in such relative positions that the two positioning pins 30a and 30b correspond to an orientation flat 4 of a semiconductor wafer 3 and the remaining positioning pin 30c corresponds to an outer periphery of a semiconductor wafer 3, as seen in FIG. 4. The positioning pins 30 are supported for up and down movement on a support block 32 which is mounted for movement along a guide bar 33 extending in parallel with the diametrical groove 23 of the stage 21. A pair of photosensors 34 and 35 are mounted in position for detecting starting and stopping points of the support block 32 when the support block 32 and hence the positioning pins 30 move along the guide bar 33. It is to be noted that a mechanism for adjusting positions of the positioning pins 30 is directions as indicated by arrow marks X and Y in FIG. 1 and angular positions $\theta$ of the positioning pins 30 in provided. The mechanism includes a knob 36 for adjusting the positioning pins 30 in the Y direction and another knob 37 for turning the positioning pins 30 around a shaft 38 to adjust the angular positions $\theta$ of the positioning pins 30.

Now, operation of the system having such a construction as described above will be described.

At first, a semiconductor wafer 3 is fed from a preceding step to the first preliminary positioning apparatus 1 by way of the air tracks 14 and is placed on the carrying member 7. As the semiconductor wafer 3 comes to the position, the three rollers 9a, 9b and 9c are brought into rolling contact with an outer periphery of the semiconductor wafer 3 so that semiconductor wafer 3 is rotated by the roller 9a which is directly coupled to a drive source not shown. Then, if an orientation flat 4 of the wafer 3 comes to a position adjacent the sensor 10 and is detected by the same, the catcher 11 is advanced until the orientation flat 4 of the wafer 4 is just caught to stop rotation of the semiconductor wafer 3. Thus, first preliminary positioning of the semiconductor wafer 3 is completed. In this condition, the carrying member 7 attracts the semiconductor wafer 3 thereto by vacuum and is then moved to the stage 21 of the second preliminary positioning apparatus 2, particularly into the diametrical groove 23 of the stage 21. It is to be noted that, upon starting of the carrying member 7, the rollers 9a to 9c and the catcher 11 are removed from the semiconductor wafer 3.

Figure 5A:
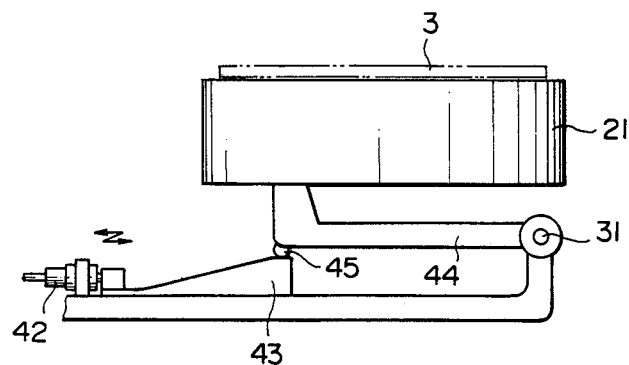
FIGS. 5A to 5C are side elevational views illustrating different operating conditions of the positioning apparatus of FIG. 1.

Then, the attracting operation of the carrying member 7 by vacuum is stopped while at the same time attracting operation of the stage 21 by vacuum is started so that the semiconductor wafer 3 is attracted to the upper faces of the stage 21 since the wafer 3 is positioned to just shut the semicircular grooves 25 of the semicircular groove groups 24 (see FIG. 5A). After then, the carrying member 7 is returned to the first preliminary positioning apparatus 1.

Figure 5B:
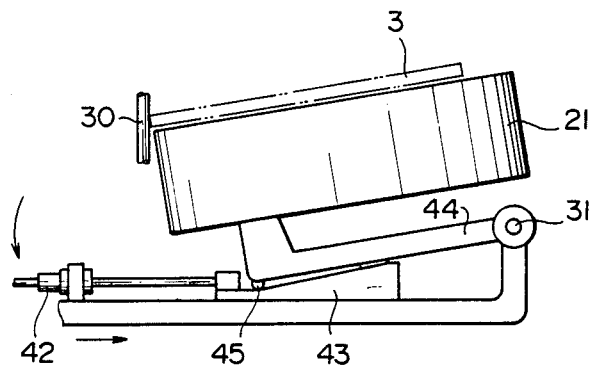
Figure 5C:
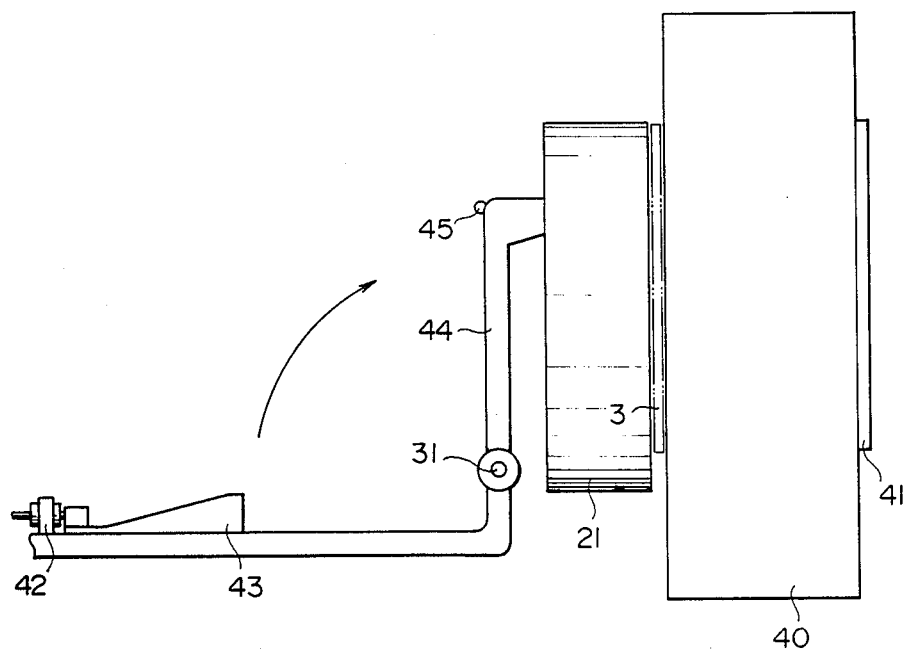

Subsequently, the plate cam 43 is pushed forward by the pin cylinder 42 so that the entire stage 21 is pivoted to an inclined position around the shaft 31 as seen in FIG. 5B. Then, the positioning pins 30 are moved along the guide bar 33 and then lowered into the notches 29 of the upper face of the stage 21. After then, the change-over means are operated so that the attracting operation of the stage 21 is stopped and now air is blown out above the faces of the stage 21 from the air ports 27 and 28 (preferably the pressure of air supply is 3 to 5 $Kgf/cm^2$). Thus, the air will flow in the grooves 26 and 25, and in this instance, in the semicircular grooves 25 of one group 24a, air flows will appear in directions as indicated by arrow marks a in FIG. 2 while in the semicircular grooves 25 of the other group 24b, air flows will appear in the opposite directions as indicated by arrow marks b. As a result, the semiconductor wafer 3 will be rotated on the faces of the stage 21 and is moved downward along the inclined faces of the stage 21 due to its own weight. In this instance, the rotating force will operate well since the semicircular grooves 25 are divided in the two separate groups 24a and 24b. Consequently, the rotation of the wafer 3 will be stopped when the orientation flat 4 of the wafer 3 is just contacted by the two pins 30a and 30b while the remaining pin 30c is contacted with an outer periphery of the semiconductor wafer 3. The second preliminary position of the semiconductor wafer 3 is attained in this manner. Then, the semiconductor wafer 3 is attracted again to the stage 21 by vacuum, thereby completing the positioning of the wafer 3. Then, the entire stage 21 is pivoted an angle of 90 degrees in the opposite direction around the shaft 31 as seen in FIG. 5C to carry the semiconductor wafer 3, for example, to a light exposure apparatus 40 having thereon an optical mask 41 of a predetermined pattern. The light exposure apparatus 40 may include an automatic positioning mechanism which will automatically accomplish final positioning of the semiconductor wafer 3 using, for example, a picture image processing means.

According to the preliminary positioning apparatus 2 having such a construction as described above, preliminary positioning of a semiconductor wafer 3 is carried out by the positioning pins 30 preset on the stage 21, and in the thus positioned condition, the semiconductor wafer 3 is attracted to the stage 21 by vacuum and then the stage 21 itself is pivoted to bring the semiconductor wafer 3 to a final positioning apparatus. Accordingly, accuracy in preliminary positioning is improved very much because a preliminarily positioned semiconductor wafer is not transported to a final positioning apparatus by way of delivery thereof by air as in a conventional preliminary positioning apparatus. Incidentally, while the accuracy in a conventional apparatus was ±150 μm to 200 μm, the accuracy in an apparatus according to the present invention was ±10 μm.

Besides, the improvement in accuracy of preliminary positioning could reduce the time required for final positioning and allow automatic final positioning of a semiconductor wafer. Meanwhile, the quantity of semiconductor wafers processed for a unit period of time (throughput) is also improved.

In addition, the preliminary positioning apparatus 2 can be maintained easily and is reduced in failure while it has a relatively simple construction.

What is claimed is:

1. An apparatus for positioning a semiconductor wafer, having a generally circular periphery with an orientation flat, relative to an exposure position, at which said wafer is exposed, comprising:

a stage adjacent said exposure position for receiving a semiconductor wafer on an upper face thereof;

a first means generating a generally circular flow of fluid between said stage and semiconductor wafer received on said stage;

a second means for engaging with said orientation flat of the semiconductor wafer;

a third means for inclining said stage toward said second means in the opposite direction from said exposure position;

a fourth means for vacuum chucking said semiconductor wafer on said stage through openings provided on said stage, and inclining means for inclining said stage toward said exposure position, while said wafer is vacuum chucked on said upper surface.

2. An apparatus according to claim 1, wherein said stage has a plurality of air directing grooves formed on a surface thereof.

3. An apparatus according to claim 1 or 2, wherein said first means is provided in the inside of said grooves.

4. An apparatus according to claim 2, wherein said grooves are separated into a plurality of groups.

5. An apparatus according to claim 2, wherein said grooves extend circularly in a concentrical relationship to each other.

6. An apparatus according to claim 5, wherein said grooves are interconnected by a connecting groove.

7. An apparatus according to claim 1, wherein the flow makes the semiconductor wafer kept above said stage.

8. An apparatus according to claim 1, wherein said first means generates an air flow.

9. An apparatus according to claim 1, wherein said first means is also capable of making vacuum between the semiconductor wafer and said stage.

* * * * *